(12) United States Patent
Ferri et al.

(10) Patent No.: US 9,335,363 B2
(45) Date of Patent: May 10, 2016

(54) MISSING OR BROKEN NEUTRAL MONITORING CIRCUIT FOR SPLIT PHASE ELECTRICAL DISTRIBUTION CONFIGURATIONS

(71) Applicant: EATON CORPORATION, Cleveland, OH (US)

(72) Inventors: Vincent Ferri, Pittsburgh, PA (US); Todd Lathrop, Oakdale, PA (US)

(73) Assignee: EATON CORPORATION, Cleveland, OH (US)

( * ) Notice: Subject to any disclaimer, the term of this patent is extended or adjusted under 35 U.S.C. 154(b) by 295 days.

(21) Appl. No.: 13/860,682

(22) Filed: Apr. 11, 2013

(65) Prior Publication Data

US 2014/0306715 A1      Oct. 16, 2014

(51) Int. Cl.
*G01R 31/02*      (2006.01)
*H02H 5/10*       (2006.01)

(52) U.S. Cl.
CPC .............. *G01R 31/024* (2013.01); *H02H 5/105* (2013.01)

(58) Field of Classification Search
CPC ................................ G01R 31/02; H02H 3/325
USPC ........................................ 361/42, 50; 324/537
See application file for complete search history.

(56) References Cited

U.S. PATENT DOCUMENTS

| | | | |
|---|---|---|---|
| 6,040,967 A | | 3/2000 | Disalvo |
| 7,292,419 B1 * | | 11/2007 | Nemir ............................. 361/42 |
| 7,440,250 B2 | | 10/2008 | Terhorst |
| 7,518,840 B2 | | 4/2009 | Elms |
| 7,554,319 B1 * | | 6/2009 | Li et al. ..................... 324/121 R |
| 2003/0086224 A1 * | | 5/2003 | Elms et al. ..................... 361/91.1 |
| 2010/0301883 A1 * | | 12/2010 | Meyers et al. ................ 324/705 |
| 2011/0074294 A1 * | | 3/2011 | Song et al. ....................... 315/77 |
| 2012/0200300 A1 * | | 8/2012 | Lamb ............................ 324/537 |

OTHER PUBLICATIONS

Wikimedia Foundation, Inc., "Split-phase electric power", Wikipedia, http://en.wikipedia.org/wiki/Split-phase_electric_power, Mar. 7, 2013, 5 pp.

Ametek Programmable Power, "Common AC Power Distribution Configurations", http://www.programmablepower.com/support/FAQs/DF_AC_Distribution.pdf. Mar. 7, 2013, 9 pp.

* cited by examiner

*Primary Examiner* — Tung X Nguyen
*Assistant Examiner* — Zannatul Ferdous
(74) *Attorney, Agent, or Firm* — Eckert Seamans Cherin & Mellott, LLC; Nathaniel C. Wilks; Grant E. Coffield

(57) ABSTRACT

A circuit for indicating a broken or missing neutral in a split phase electrical distribution configuration having an unbalanced load includes: a voltage divider configured to divide the voltage difference between a first line and a second line and to output the divided voltage difference as a virtual neutral; a rectifier including an input of the virtual neutral, the neutral, and an output, the rectifier configured to rectify a voltage difference between the virtual neutral and the neutral; a determination circuit including an input of the rectified voltage difference, a reference voltage and an output, the determination circuit configured to determine if the neutral is missing or broken based on the rectified voltage difference and the reference voltage; and an indicator circuit configured to indicate when the neutral is missing or broken based on the output of the determination circuit.

16 Claims, 2 Drawing Sheets

MISSING OR BROKEN NEUTRAL MONITORING CIRCUIT FOR SPLIT PHASE ELECTRICAL DISTRIBUTION CONFIGURATIONS

BACKGROUND

1. Field

The disclosed concept relates generally to monitoring circuits, and in particular, to monitoring circuits for use in split phase electrical distribution configurations.

2. Background Information

Split phase electrical distribution configurations are well known in the art. One known split phase electrical distribution configuration is the 120/240 single phase electrical distribution configuration shown in FIG. 1. The 120/240 single phase electrical distribution configuration is used in many residential and commercial applications in North America.

Referring to FIG. 1, the 120/240 single phase electrical distribution configuration has first and second lines L1,L2 and a neutral N. In the 120/240 single phase electrical distribution configuration, the line-neutral voltages $V_1,V_2$ are 120V and the line-line voltage $V_3$ is 240V under normal operating conditions. A first facility load $R_{1LOAD}$ is electrically connected between the first line L1 and the neutral N and a second facility load $R_{2LOAD}$ is electrically connected between the second line L2 and the neutral N. The purpose of the neutral N is to maintain the equal voltages across the first and second facility loads $R_{1LOAD},R_{2LOAD}$, regardless of whether the facility loads $R_{1LOAD},R_{2LOAD}$ are unbalanced.

However, if the neutral N is broken or missing, and the facility loads $R_{1LOAD},R_{2LOAD}$ are unbalanced, then the voltages across the facility loads $R_{1LOAD},R_{2LOAD}$ become unequal. The unequal voltages can create an overvoltage condition (e.g., without limitation, applying an excessive voltage to an appliance) which can damage equipment as well as create a dangerous situation. It would therefore be desirable to monitor the status of the neutral wire.

There is room for improvement in monitoring circuits.

SUMMARY

These needs and others are met by embodiments of the disclosed concept, which provide a circuit for indicating a broken or missing neutral in a split phase electrical distribution configuration.

In accordance with one aspect of the disclosed concept, a circuit for indicating a broken or missing neutral in a split phase electrical distribution configuration having a first line, a second line, a neutral, and an unbalanced load comprises: a voltage divider including an input of a voltage difference between the first line and the second line, and an output, the voltage divider configured to divide the voltage difference and to output the divided voltage difference as a virtual neutral; a rectifier including an input of the virtual neutral, the neutral, and an output, the rectifier configured to rectify a voltage difference between the virtual neutral and the neutral; a determination circuit including an input of the rectified voltage difference, a reference voltage and an output, the determination circuit configured to determine if the neutral is missing or broken based on the rectified voltage difference and the reference voltage; and an indicator circuit configured to indicate when the neutral is missing or broken based on the output of the determination circuit.

As another aspect of the disclosed concept, a circuit for detecting a broken or missing neutral in a split phase electrical distribution configuration having a first line, a second line, a neutral, and an unbalanced load comprises: a power supply configured to use alternating current power from the first and second lines to create direct current power; a voltage divider including an input of a voltage difference between the first line and the second line, and an output, the voltage divider configured to divide the voltage difference and to output the divided voltage difference as a virtual neutral; a rectifier including an input of the virtual neutral, the neutral, and an output, the rectifier configured to rectify a voltage difference between the virtual neutral and the neutral; a determination circuit including an input of the rectified voltage difference, a reference voltage and an output, the determination circuit configured to determine if the neutral is missing or broken based on the rectified voltage difference and the reference voltage; and an indicator circuit configured to indicate when the neutral is missing or broken based on the output of the determination circuit.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
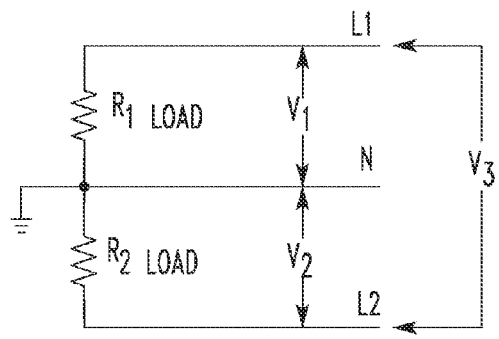
FIG. 1 is a circuit diagram of a split phase electrical distribution configuration.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

Figure 2:
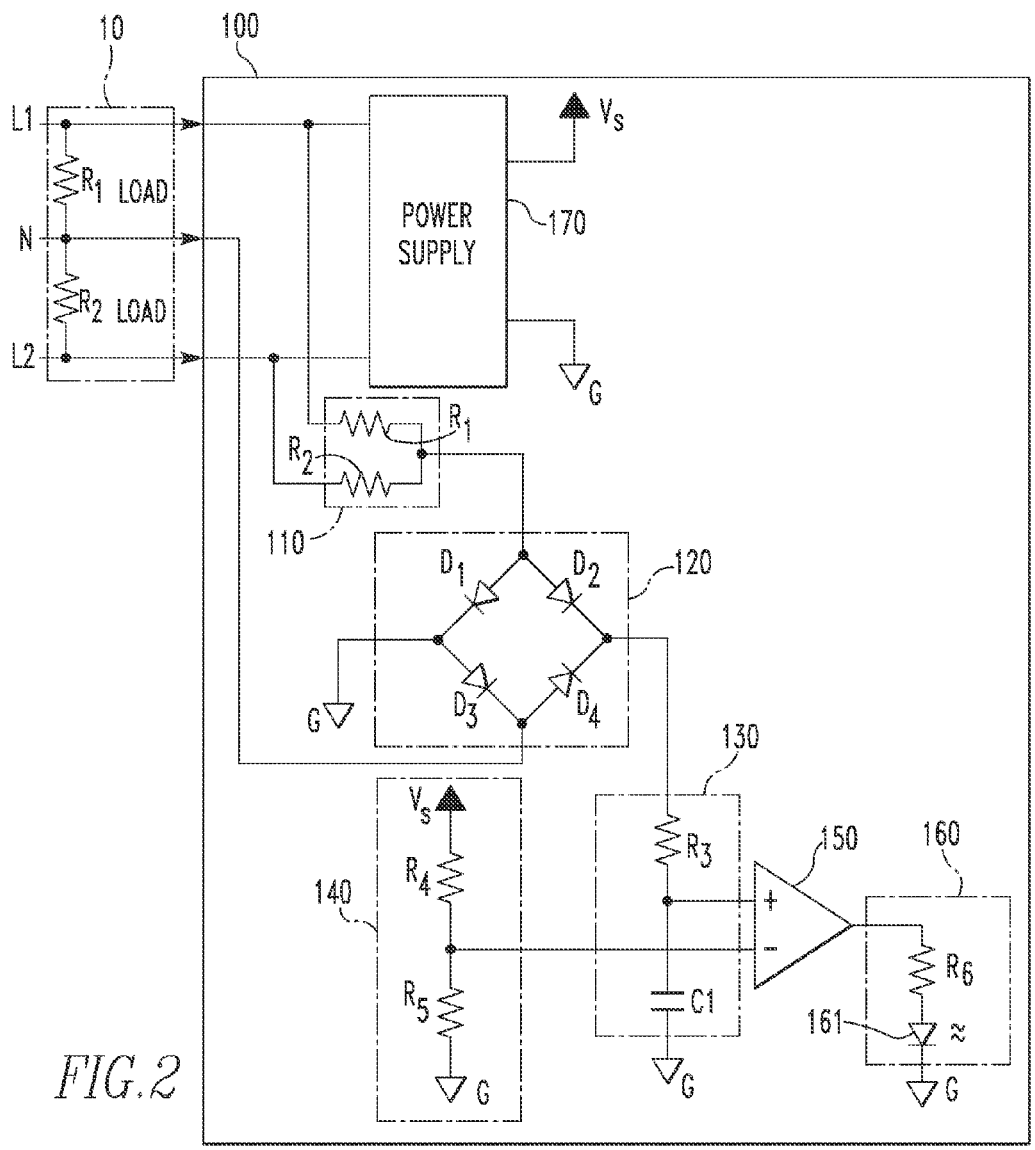
FIG. 2 is a circuit diagram of a monitoring circuit in accordance with an example embodiment of the disclosed concept.

Referring to FIG. 2, a split phase electrical distribution configuration (e.g., without limitation, a 120/240 single phase electrical distribution configuration) includes first and second lines L1,L2 and a neutral N. In the example split phase electrical distribution configuration, voltage provided by the first line L1 is 180 degrees out of phase with voltage provided by the second line L2. The electrical distribution configuration also includes a first facility load $R_{1LOAD}$ electrically connected between the first line L1 and the neutral N, and a second facility load $R_{2LOAD}$ electrically connected between the second line L2 and the neutral N. The first and second facility loads $R_{1LOAD},R_{2LOAD}$ are located in a facility 10 (e.g., without limitation, a residential or commercial property).

A circuit 100 for indicating a broken or missing neutral is electrically connected to the first and second lines L1,L2 and the neutral N of the split phase electrical distribution configuration. The circuit 100 includes a voltage divider 110, a rectifier 120, a detection circuit having a filter 130, a reference voltage generator 140, and a comparator 150, an indicator circuit 160, and a power supply 170.

The voltage divider 110 is electrically connected to the first and second lines L1,L2 and is configured to divide a voltage difference between the first line L1 and the second line L2. The voltage divider 110 outputs the divided voltage difference as a virtual neutral. The voltage divider 110 includes first and second resistances R1,R2 which are substantially equal to each other, and the output of the voltage divider is provided from a point between the first and second resistances R1,R2. The first and second resistances R1,R2 being substantially equal causes the virtual neutral output from the voltage divider 110 to be an average of the voltage of the first line L1 and the voltage of the second line L2.

Voltages of the virtual neutral and the real neutral N are input into the rectifier 120. The rectifier 120 rectifies the voltage difference between the virtual neutral and the neutral N. When the voltages of the virtual neutral and the neutral N are equal, such as when the neutral N is present and unbroken, the output of the rectifier will be about 0V. However, when the neutral N is broken or missing and the facility loads $R_{1LOAD}$, $R_{2LOAD}$ are unbalanced, voltages of the virtual neutral and the neutral N will be different. The example rectifier 120 disclosed in FIG. 2 is a full-wave rectifier including first through fourth diodes D1,D2,D3,D4. However, it will be appreciated by those having ordinary skill in the art that any suitable rectifier circuit may be employed as rectifier 120.

The output of the rectifier 120 is provided to the determination circuit 130,140,150. The determination circuit 130, 140,150 includes the filter 130, the reference voltage generator 140, and the comparator 150, The determination circuit 130,140,150 determines if the neutral N is broken or missing based on the rectified voltage difference between the virtual neutral and the neutral N, and the reference voltage. In more detail, the filter 130 receives and filters the rectified voltage difference output from the rectifier 120. The filter 130 provides the filtered rectified voltage difference to a first input (+) of the comparator. The example filter 130 includes a resistor R3 electrically connected between the output of the rectifier 120 and the first input of the comparator 150 and a capacitor C1 electrically connected between the first input of the comparator 150 and a ground. However, it will be appreciated by those having ordinary skill in the art that any suitable filtering circuit may be employed as filter 130 without departing from the scope of the disclosed concept.

The reference voltage generator 140 generates the reference voltage and provides it to a second input (−) of the comparator 150. The example reference voltage generator 140 includes two resistors R4,R5 arranged as a voltage divider configured to divide a direct current supply voltage $V_S$ to generate the reference voltage. However, it will be appreciated by those having ordinary skill in the art that any suitable mechanism or circuit for generating the reference voltage may be employed without departing from the scope of the disclosed concept. In some example embodiments of the disclosed concept, the reference voltage is in a range of about 2.5V to about 10V, but it will be appreciated that the disclosed concept is not limited thereto.

The comparator 150 receives and compares the filtered rectified voltage difference and the reference voltage. When the filtered rectified voltage difference is greater than the reference voltage, the determination circuit 130,140,150 determines that the neutral N is missing or broken and the comparator 150 provides a suitable output voltage to the indicator circuit 160.

When the indicator circuit 160 receives the suitable output voltage from comparator 150, the indicator circuit 160 provides an indication that the neutral N is broken or missing. In the example embodiment illustrated in FIG. 2, the indicator circuit 160 includes a resistor R6 and an indicator 161 (e.g., without limitation, a light emitting diode) that illuminates to indicate that the neutral is missing or broken. However, it will be appreciated that any suitable audible, visual or electrical indicator may be employed.

Figure 3:
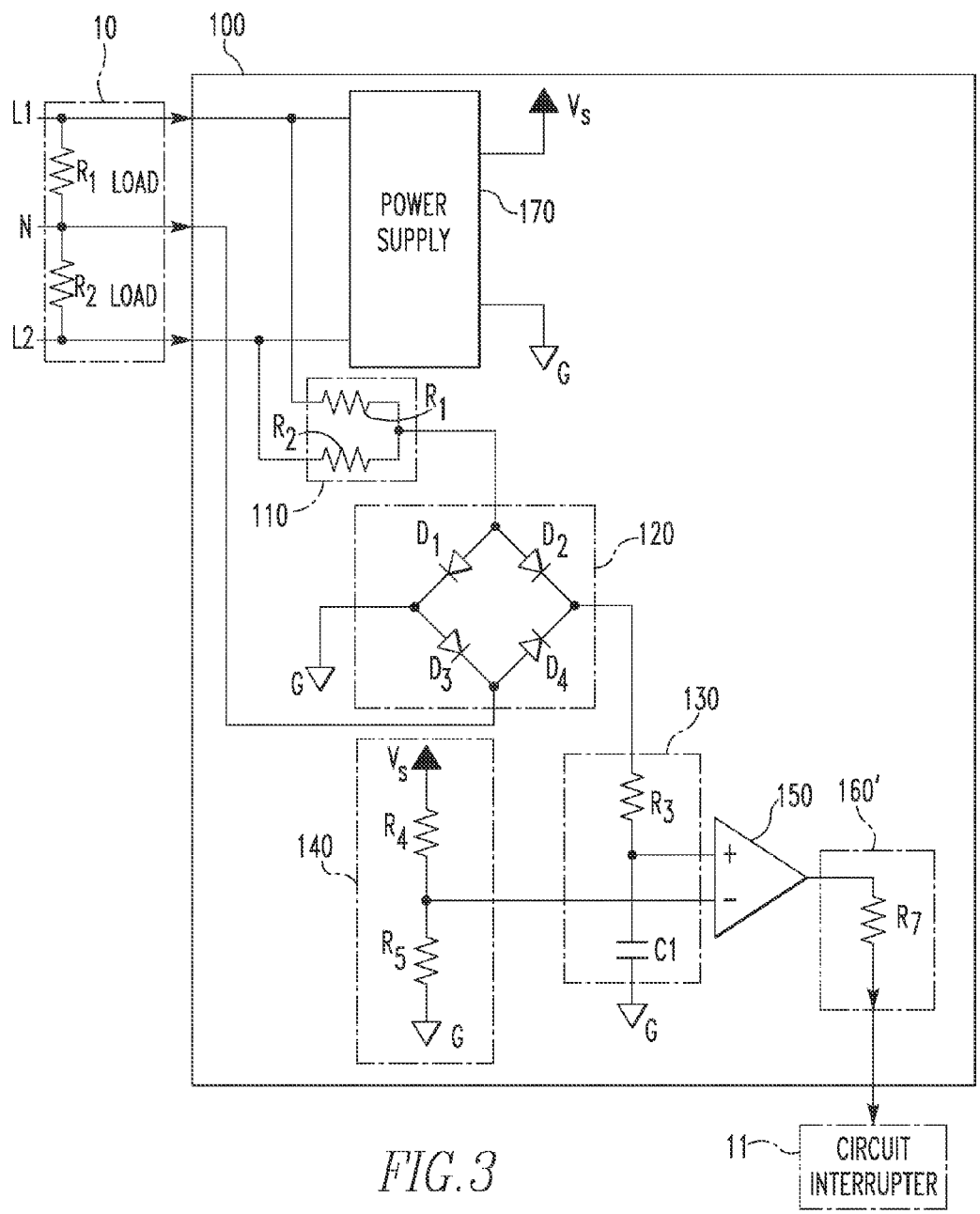
FIG. 3 is a circuit diagram a monitoring circuit in accordance with another example embodiment of the disclosed concept.

Referring to FIG. 3, another example of an indicator circuit 160' is shown. Rather than using a light as an indication that the neutral N is broken or missing, the indicator circuit 160' provides a signal as the indication that the neutral N is broken or missing. The signal may be provided to, for example and without limitation, an external circuit interrupter 11. The external circuit interrupter 11 may use the signal to, for example and without limitation, trip one or more power circuits in the facility 10 to protect the facility 10 from unbalanced voltage conditions caused by the broken or missing neutral N.

Referring back to FIG. 2, the circuit 100 further includes a power supply 170. The power supply 170 is configured to use alternating current power from the first and second lines L1,L2 to create a direct current supply power $V_S$ and a ground G. The direct current supply power $V_S$ and the ground G are used by the determination circuit 130,140,150 to power the comparator 150 and to generate the reference voltage. The power supply 170 is not electrically connected to the neutral N, and thus the direct current supply power $V_S$ and ground G used in the circuit are not compromised when the neutral N is missing or broken.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit for indicating a broken or missing neutral in a split phase electrical distribution configuration having a first line, a second line, a neutral, and an unbalanced load, the circuit comprising:
    a voltage divider including an input of a voltage difference between the first line and the second line, and an output, the voltage divider configured to divide the voltage difference and to output the divided voltage difference as a virtual neutral;
    a rectifier including an input of the virtual neutral, the neutral, and an output, the rectifier configured to rectify a voltage difference between the virtual neutral and the neutral;
    a determination circuit including an input of the rectified voltage difference, a reference voltage and an output, the determination circuit configured to determine if the neutral is missing or broken based on the rectified voltage difference and the reference voltage; and
    an indicator circuit configured to indicate when the neutral is missing or broken based on the output of the determination circuit.

2. The circuit of claim 1, wherein the output of the voltage divider is an average of a voltage of the first line and a voltage of the second line.

3. The circuit of claim 1, wherein the voltage divider further includes a first resistance and a second resistance substantially equal to the first resistance; wherein the first resistance and the second resistance are electrically connected between the first line and the second line; and wherein the output of the voltage divider is provided from a point between the first resistance and the second resistance.

4. The circuit of claim 1, wherein the determination circuit further includes a filter configured to filter the rectified voltage difference and a comparator configured to compare the filtered rectified voltage difference with the reference voltage; and wherein the determination circuit determines that the neutral is missing or broken when the filtered rectified voltage difference is greater than the reference voltage.

5. The circuit of claim 4, wherein the filter further includes a third resistance electrically connected between the output of the rectifier and a first input of the comparator and a first capacitance electrically connected between the first input of the comparator and a ground.

6. The circuit of claim 1, wherein the determination circuit further includes a reference voltage generator configured to generate the reference voltage; and wherein the reference voltage generator includes a fourth resistance and a fifth resistance configured to divide a supply voltage to generate the reference voltage.

7. The circuit of claim 1, wherein the reference voltage is in a range of about 2.5V to about 10V.

8. The circuit of claim 1, wherein the rectifier is a full-wave rectifier.

9. The circuit of claim 1, wherein the indicator circuit includes an indicator configured to illuminate when the determination circuit determines that the neutral is missing or broken.

10. The circuit of claim 9, wherein the indicator is a light emitting diode.

11. The circuit of claim 1, wherein the indicator circuit is further configured to provide an indication to an external circuit interrupter when the determination circuit determines that the neutral is missing or broken.

12. The circuit of claim 1, wherein a voltage of the first line is 180 degrees out of phase with a voltage of the second line.

13. A circuit for indicating a broken or missing neutral in a split phase electrical distribution configuration having a first line, a second line, a neutral, and an unbalanced load, the circuit comprising:
 a power supply configured to use alternating current power from the first and second lines to create direct current power;
 a voltage divider including an input of a voltage difference between the first line and the second line, and an output, the voltage divider configured to divide the voltage difference and to output the divided voltage difference as a virtual neutral;
 a rectifier including an input of the virtual neutral, the neutral, and an output, the rectifier configured to rectify a voltage difference between the virtual neutral and the neutral;
 a determination circuit including an input of the rectified voltage difference, a reference voltage and an output, the determination circuit configured to determine if the neutral is missing or broken based on the rectified voltage difference and the reference voltage; and
 an indicator circuit configured to indicate when the neutral is missing or broken based on the output of the determination circuit.

14. The circuit of claim 13, wherein the power supply is not electrically connected to the neutral.

15. The circuit of claim 13, wherein the determination circuit is powered by the direct current power from the power supply.

16. The circuit of claim 15, wherein the determination circuit further includes a reference voltage generator configured to generate the refrence voltage; wherein the reference voltage generator receives a direct current supply voltage from the power supply; and wherein the reference voltage generator divides the direct current supply voltage to generate the reference voltage.

* * * * *